(12) United States Patent
Yoshioka et al.

(10) Patent No.: US 11,133,143 B2
(45) Date of Patent: Sep. 28, 2021

(54) INTEGRATED POWER-GROUND REVERSE WIRING PROTECTION CIRCUIT

(71) Applicant: TEXAS INSTRUMENTS INCORPORATED, Dallas, TX (US)

(72) Inventors: Masahiro Yoshioka, Allen, TX (US); Muhammad Yusuf Ali, Allen, TX (US); Kevin Ryan Duke, McKinney, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 102 days.

(21) Appl. No.: 16/585,259

(22) Filed: Sep. 27, 2019

(65) Prior Publication Data

US 2020/0111634 A1 Apr. 9, 2020

Related U.S. Application Data

(60) Provisional application No. 62/742,601, filed on Oct. 8, 2018.

(51) Int. Cl.
*H03M 1/06* (2006.01)
*H01H 83/04* (2006.01)
*G05F 1/56* (2006.01)

(52) U.S. Cl.
CPC ............ *H01H 83/04* (2013.01); *G05F 1/561* (2013.01); *H03M 1/06* (2013.01)

(58) Field of Classification Search
CPC ............... H04B 10/40; H04B 10/2575; H04B 10/25891; H04B 10/564; H02M 3/158; H01L 27/0255; H01L 2224/48227; H01L 2224/49109; H01L 2924/00; H01L 2924/00014; H01L 2224/48091; H01L 2924/13091
See application file for complete search history.

(56) References Cited

U.S. PATENT DOCUMENTS

| 4,959,642 | A | * | 9/1990 | Sharples | G09F 9/35 324/96 |
| 5,698,970 | A | * | 12/1997 | Stanojevic | G05F 1/613 323/223 |
| 5,841,643 | A | * | 11/1998 | Schenkel | H02M 3/33507 363/21.13 |

* cited by examiner

*Primary Examiner* — Bryan R Perez
(74) *Attorney, Agent, or Firm* — John R. Pessetto; Charles A. Brill; Frank D. Cimino

(57) ABSTRACT

A two-wire current loop system includes a current loop with a transmitter and a host. The system also includes a monolithic integrated circuit included with the transmitter. The monolithic integrated circuit includes: 1) a power supply terminal coupled to the current loop; 2) a loop ground terminal coupled to the current loop and configured to output a current to the current loop; 3) device circuitry with a power supply node and an internal ground node, wherein the power supply node is coupled to the power supply terminal; and 4) a reverse wiring protection circuit coupled between the internal ground node of the device circuitry and the loop ground terminal.

12 Claims, 5 Drawing Sheets

INTEGRATED POWER-GROUND REVERSE WIRING PROTECTION CIRCUIT

CROSS-REFERENCE TO RELATED APPLICATIONS

This application claims priority to U.S. Provisional Application No. 62/742,601, filed Oct. 8, 2018, which is hereby incorporated by reference.

BACKGROUND

Loop-powered DAC (digital-to-analog converter) systems are widely used in factory automation and process automation. In a loop-powered DAC system, two wires between a host and a sensor transmitter enable supply of power from the host to the sensor transmitter as well as bidirectional communication through current flow information. Thus, a loop-powered DAC system is referred to as a 2wire system and/or the devices of the loop-powered DAC system are referred to as 2wire or loop-powered devices. One of the ongoing issues with loop-powered devices is referred to as reverse wiring. In an example reverse wiring scenario, an electrical system assembler incorrectly connects the pins or terminals of a loop-powered device based on an integrated circuit (IC) to the external loop. A similar stress also occurs when a huge surge stress comes to the loop-powered system. In such scenarios, the loop-powered device does not function, and damage to the loop-powered device may occur. Efforts to protect loop-powered devices in a reverse wiring scenario in a low-cost and efficient way are ongoing.

SUMMARY

A two-wire current loop system comprises a current loop with a transmitter and a host. The system also comprises a monolithic integrated circuit included with the 4300-0659US 1 transmitter. The monolithic integrated circuit includes: 1) a power supply terminal coupled to the current loop; 2) a loop ground terminal coupled to the current loop and configured to output a current to the current loop; 3) device circuitry with a power supply node and an internal ground node, wherein the power supply node is coupled to the power supply terminal; and 4) a reverse wiring protection circuit coupled between the internal ground node of the device circuitry and the loop ground terminal.

In accordance with one example of the disclosure, a two-wire loop-powered device comprises a monolithic integrated circuit with: 1) a power supply terminal; 2) a loop ground terminal; 3) device circuitry having power supply node and an internal ground node, wherein the power supply node of the device circuitry is coupled to the power supply terminal; and 4) a reverse wiring protection circuit coupled between the internal ground node of the device circuitry and the loop ground terminal.

In accordance with one example of the disclosure, a monolithic integrated circuit comprises a power supply terminal and a loop ground terminal. The monolithic integrated circuit also comprises: 1) device circuitry coupled to the power supply terminal; and 2) a reverse wiring protection circuit coupled between an internal ground node of the device circuitry and the loop ground terminal.

BRIEF DESCRIPTION OF THE DRAWINGS

For a detailed description of various examples, reference will now be made to the accompanying drawings in which.

DETAILED DESCRIPTION

Disclosed herein are loop-powered devices (e.g., a loop-powered transmitter device or loop-powered transmitter component) having a monolithic integrated circuit (IC) with device circuitry and with a low-side reverse wiring protection circuit. In some examples, the device circuitry include circuits that are insensitive to a ground bounce effect and/or circuits with a ground bounce compensation feature. In some examples, a loop-powered device with the disclosed monolithic integrated circuit arrangement is part of a two-wire current loop system. In one example, a two-wire current loop system includes a current loop with a transmitter and a host. The two-wire current loop system also includes a loop-powered device (e.g., part of the transmitter) along the current loop, where the loop-powered device includes a monolithic integrated circuit. The monolithic integrated circuit includes: 1) a power supply terminal coupled to the current loop; 2) an loop ground terminal coupled to the current loop and configured to output a current to the current loop; 3) device circuitry with a power supply node and an internal ground node, where the power supply node of the device circuitry is coupled to the power supply terminal; and 4) a low-side reverse wiring protection circuit coupled between the internal ground node of the device circuitry and the loop ground terminal. In some examples, the device circuitry includes a current output digital-to-analog converter (DAC) circuit. In other examples, the device circuitry includes an analog-to-digital converter (ADC) circuit and a voltage output DAC circuit with ground sense architecture. In other examples, the device circuitry includes a voltage-to-current converter (V2I) circuit. In other examples, the device circuit includes an XTR two-stage operational amplifier circuit.

In the disclosed examples, the reverse wiring protection circuit is a low-side reverse wiring protection circuit, meaning that the reverse wiring protection circuit is between an internal ground node of the device circuitry and a loop ground terminal of the loop-powered device. In some examples, a low-side reverse wiring protection circuit includes a PNP (p-type/n-type/p-type) bipolar device (referred to as a "PNP device" herein), which operates as a diode having its anode coupled to the internal ground node of the device circuitry and its cathode coupled to the loop ground terminal. In some examples, a low-side reverse wiring protection circuit also includes an active switch (e.g., a DENMOS FET). When the device circuitry is turned on, the active switch is turned on to avoid a diode drop across the PNP device. In this manner, the headroom requirements for the device circuitry are not increased due to the reverse wiring protection circuit. To provide a better understanding, various two-wire current loop options, loop-powered device options, and reverse wiring protection circuit options are described using the figures as follows.

Figure 1A:
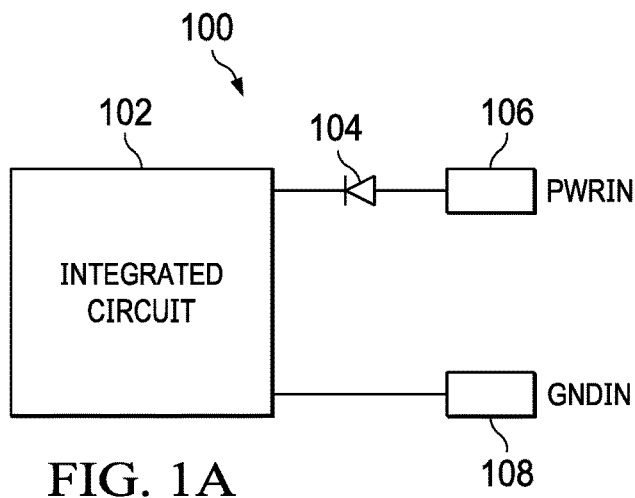
FIGS. 1A-1C show an integrated circuit with a power rail protection circuit in accordance with some examples.
Figure 1B:
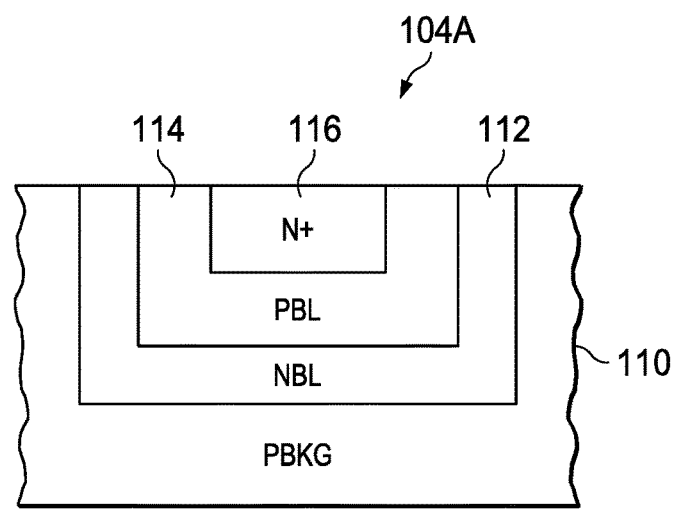
Figure 1C:
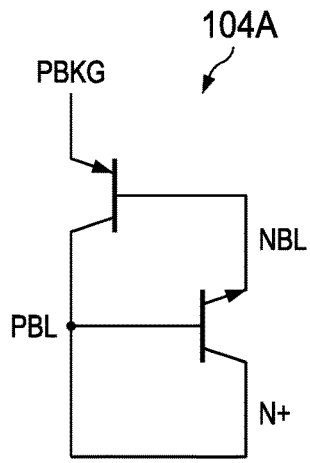

FIGS. 1A-1C show an integrated circuit (IC) 102 with a power rail diode 104 in accordance with some examples. In FIG. 1A, the IC 102 is coupled between a power supply (PWRIN) terminal 106 and an internal ground (GNDIN) terminal 108. As shown, the power rail diode 104 is between the IC 102 and the power supply terminal 106. More specifically, the anode of the power rail diode 104 faces the power supply terminal 106 and the cathode of the power rail diode 104 faces the IC 102.

In FIG. 1B, a representation of various semiconductor layers for a power rail protection device 104A (e.g., the power rail diode 104 in FIG. 1). As shown, the power rail protection device 104A includes a p-type back gate (PBKG) 110, an n-type buried layer (NBL) 112, a p-type buried layer (PBL) 114, and an n-type (N+) channel 116. In FIG. 1C, a circuit representation of the power rail protection device 104A is given. The power rail protection device 104A represented in FIGS. 1B and 1C is an NPN bipolar transistor between the N+ channel 116 and the NBL 112 through the PBL 114.

With the power rail diode 104 or power rail protection device 104A in FIGS. 1A-1C, reverse wiring protection is provided by an NPN transistor with N+, PBL and NBL junctions. However, this arrangement induces a parasitic PNP bipolar transistor due to a PBKG-Nwell junction. The potential of the PBKG 110 is set to a GND rail of the IC 102 to avoid a forward bias current leak between the NBL 112 and the PBKG 110, which causes a significant amount of PNP parasitic bipolar transistor leakage while the NPN bipolar transistor turns on. Thus, the PBKG 110 of the protection device 104A needs to connect with the PBL 114 (coupled to the power supply node 106) instead and the protection device 104A cannot co-exist with the IC 102 in a monolithic die.

In the disclosed examples, a diode is placed on the low-side (ground side) of IC circuitry rather than the high-side (power supply side). In IC design, use of a low-side diode is unexpected because communication accuracy issues arise if there is mismatch between the GND node of an IC and the GND node of other system components (e.g., a host). In a two-wire current loop system, it has been determined that GND potential mismatch does not cause communication accuracy issues because the communication is based on current flow information and the reference voltage can be obtained from the GND_IC potential available on a sensor transmitter board. Thus, in some examples, a monolithic IC with loop-powered circuitry includes a low-side diode corresponding to a PNP bipolar transistor between P+ and PBL through N+ (see e.g., FIGS. 4A and 4B). By connecting N+ with NBL as well as PBL with PBKG, collector currents on both parasitic PNP and NPN remains zero. In addition, the PBKG node becomes the GND_IC node, which is the lowest potential of the monolithic IC. Thus, this diode can co-exist with the loop-powered circuitry in a monolithic IC.

Figure 2:
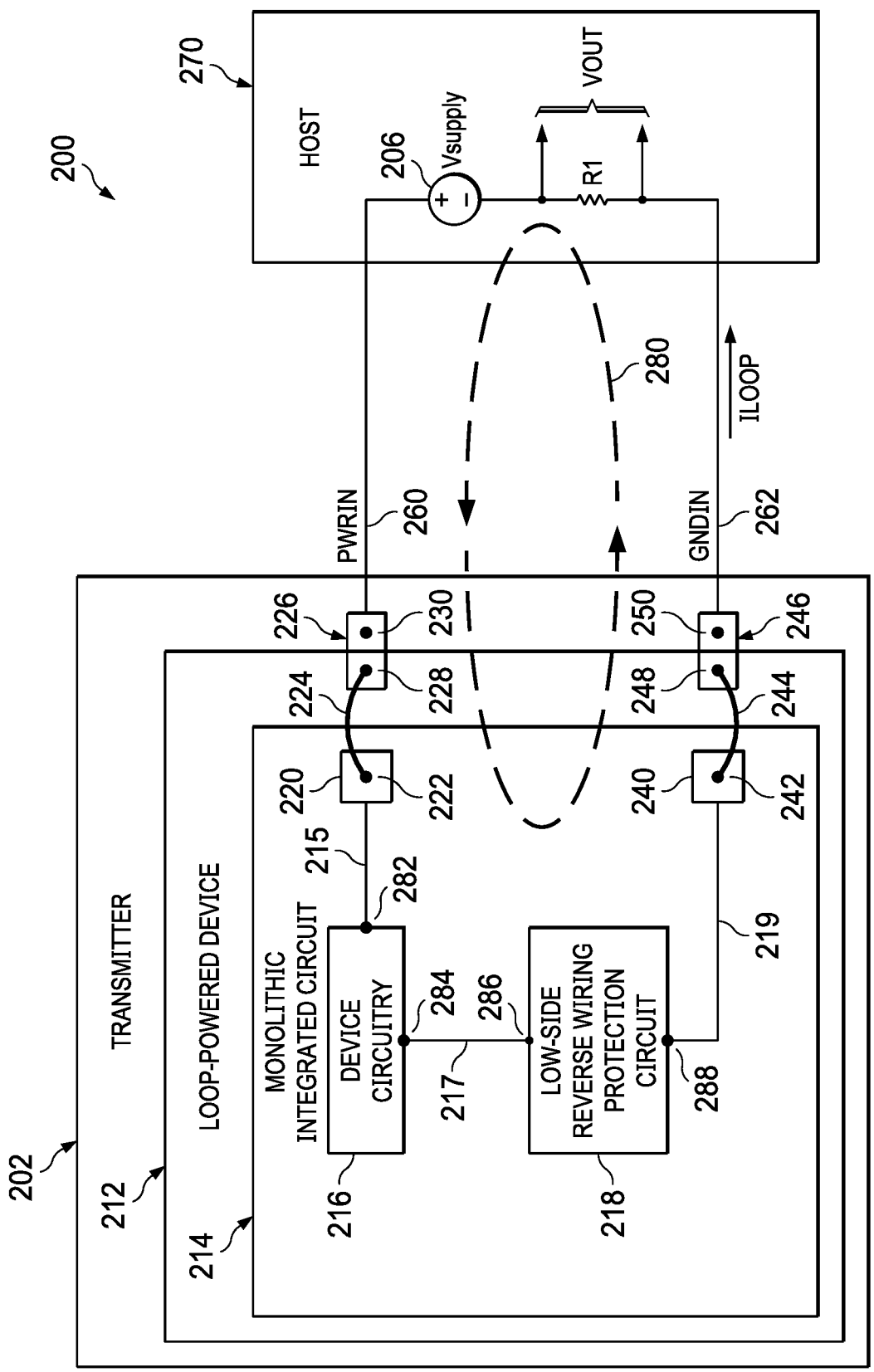
FIG. 2 is a block diagram showing a two-wire current loop system in accordance with some examples.

FIG. 2 is a block diagram showing a two-wire current loop system 200 in accordance with some examples. As shown, the two-wire current loop system 200 includes a transmitter 202 coupled to a host 270 modeled as a power supply (Vsupply) 206 and a load resistor (R1). When coupled together the transmitter 102 and the host 270 form a current loop 180. As shown, each of the transmitter 202 and the host 270 has two terminals. Thus, each of the components in the two-wire current loop system 200 may be referred to as a two-wire component. In other examples, multiple transmitters and/or multiple hosts are included in a two-wire current loop system such as the two-wire current loop system 200.

In the example of FIG. 2, the power supply 206 is a DC source configured to maintain a stable current in the current loop 280. In different examples, the power supply 206 provides 12V DC, 24V DC, 36V DC, or other DC values. The particular DC value for the power supply 206 will be selected based on the number of components included in the current loop 280, since the power supply voltage needs to be larger than the sum of all the voltage drops in the two-wire current loop system 200.

In the example of FIG. 1, the transmitter 202 includes a loop-powered device 212 that forms part of the current loop 280. In some examples, the loop-powered device 212 is coupled to a sensor or other device. In such examples, the loop-powered device 212 operates as a transducer that converts a sensed value (e.g., voltage, current, or resistance, or changes in voltage, current, or resistance) into a current for conveyance along the current loop 280.

In the example of FIG. 2, the host 270 includes a resistor (R1), which provides a voltage value (VOUT) based on the loop current (ILOOP). Thus, the state of ILOOP can be analyzed using VOUT and used for control functions (e.g., starting an operation/component, stopping an operation/component, etc.).

As shown, the loop-powered device 212 includes a monolithic IC 214 with device circuitry 216 and a low-side reverse wiring protection circuit 218. In different examples, the device circuitry 216 includes one or more of a current output DAC circuit, an ADC circuit, a voltage output DAC circuit with ground sense architecture, a V2I circuit, and an XTR two-stage operational amplifier circuit. In some examples, the loop-powered device 212 operates as a transducer for a sensor input, where the sensor is included with the loop-powered device 212 or is separate from the loop-powered device 212.

In the example of FIG. 2, the way in which the device circuitry 216 and the low-side reverse wiring protection circuit 218 are coupled to other components of the current loop 280 is important. Accordingly, a representation of various electrical nodes, IC terminals (e.g., pads), and pins are given in FIG. 2 for clarity. As shown, the device circuitry 216 of the monolithic IC 214 includes a power supply node 282 and an internal ground node 184. Also, the low-side reverse wiring protection circuit 218 of the monolithic IC 214 includes an input node 286 and an output node 288. Briefly, the power supply node 282 of the device circuitry 216 receives a power supply voltage (PWRIN) from the current loop 280 via various wires, couplings, nodes, pins, terminals, etc.

More specifically, the power supply node 282 of the device circuitry 216 is coupled to a power supply terminal 220 via a conductive trace 215. Also, the power supply terminal 220 is coupled to a power supply pin 226 of the loop-powered device 212 via a wire or lead 224. In FIG. 1, dot 222 represents a solder joint or other conductive coupling to join one end of the lead 224 with the power supply terminal 220. Also, dot 228 represents a solder joint or other conductive coupling to join the other end of the lead 124 to the power supply pin 226. The power supply pin 226 is coupled to a wire 260 that forms part of the current loop 280, where dot 230 represents a solder joint or other conductive coupling to join the wire 260 with the power supply pin 226. When the loop-powered device 212 is properly coupled to the current loop 280, the device circuitry 216 is able to a receive PWRIN, where PWRIN is a function of the power supply 206 and any voltage drops in the two-wire current loop system 200.

As shown, the internal ground node 284 of the device circuitry 216 is coupled to the input node 286 of the low-side reverse wiring protection circuit 218 via a conductive trace 217. Also, the output node 288 of the low-side reverse wiring protection circuit 218 is coupled to the current loop 280 and outputs a current via various wires, couplings, nodes, pin, terminals, etc. More specifically, the output node 288 of the low-side reverse wiring protection circuit 218 is coupled to a loop ground terminal 240 for the monolithic IC 214 via a conductive trace 219. Also, the loop ground terminal 240 is coupled to a ground (GNDIN) pin 246 of the loop-powered device 212 via a wire or lead 244. In FIG. 2, dot 242 represents a solder joint or other conductive coupling to join one end of the lead 244 with the loop ground terminal 240. Also, dot 248 represents a solder joint or other conductive coupling to join the other end of the lead 244 to the ground pin 246. The ground pin 246 is coupled to a wire 262 that forms part of the current loop 280, where dot 250 represents a solder joint or other conductive coupling to join the wire 262 with the output current pin 246. When the loop-powered device 212 is properly coupled to the current loop 280, the output current from the device circuitry 216 is passed to the current loop 280 via the low-side reverse wiring protection circuit 218. If the loop-powered device 212 is not properly coupled to the current loop 280 or a test circuit, the low-side reverse wiring protection circuit 218 protects the device circuitry 216 from damage.

Figure 3:
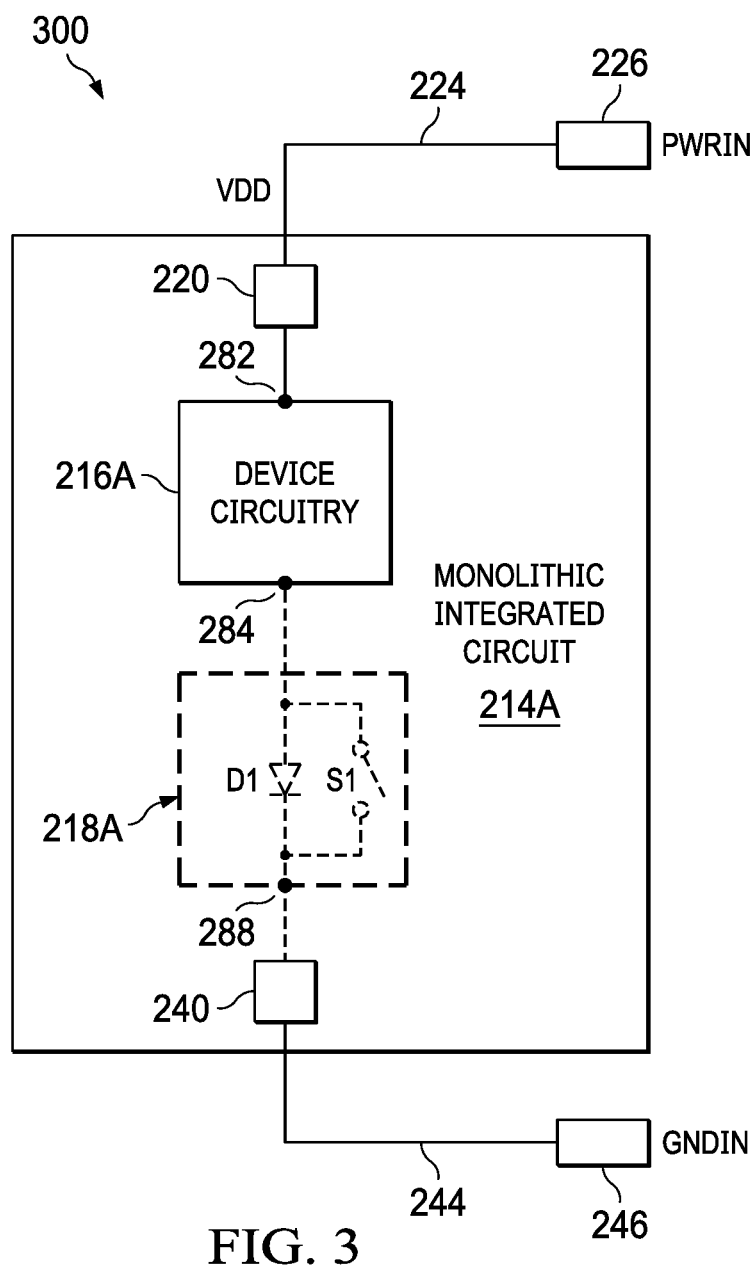
FIG. 3 is a diagram showing a two-wire loop-powered device with a low-side reverse wiring protection circuit in accordance with some examples.

FIG. 3 is a diagram showing a two-wire loop-powered device 300 (an example of the loop-powered device 212 in FIG. 2) with a low-side reverse wiring protection circuit 218A (an example of the low-side reverse wiring protection circuit 218 in FIG. 2) in accordance with some examples. As shown, the two-wire loop-powered device 300 includes a monolithic IC 214A (an example of the monolithic IC 214 in FIG. 2) with device circuitry 216A (an example of the device circuitry 216 in FIG. 2) and the low-side reverse wiring protection circuit 218A. In the example of FIG. 3, the low-side reverse wiring protection circuit 218A corresponds to a diode (D1) in parallel with a switch (S1). More specifically, in the example of FIGS. 3, D1 and S1 of the low-side reverse wiring protection circuit 218A are represented as extending in parallel between node 306 (corresponding to the internal ground node 284 and/or the input node 286 in FIG. 2) and the output node 288 of the low-side reverse wiring protection circuit 218A.

To couple the device circuitry 216A to a current loop as represented in FIG. 2, a conductive path is formed between the power supply node 282 of device circuitry 216A, the power supply terminal 220, the lead 224, and the power supply pin 226 as described in FIG. 2. Also, to couple the low-side reverse wiring protection circuit 218A to a current loop as represented in FIG. 2, a conductive path is formed between the output node 288 of the low-side reverse wiring protection circuit 218A, the loop ground terminal 240, the lead 244, and the ground pin 246 as described in FIG. 2.

When the loop-powered device 300 is properly coupled to a current loop as represented in FIG. 2, the device circuitry 216A is able to a receive PWRIN at the power supply pin 226 and output a current to the ground pin 246. If the loop-powered device 300 is improperly coupled to the current loop 280 or a test circuit, the low-side reverse wiring protection circuit 218A protects the device circuitry 216A from damage.

FIG. 4 is a cross-sectional view of a PNP device 400 (an example of D1 in FIG. 3) for the low-side reverse wiring protection circuit 218A of FIG. 3 in accordance with some examples. As shown, the PNP device 400 includes a p-type substrate or back gate (PBKG in FIG. 4) 402, an n-type buried layer (NBL in FIG. 4) 404 over the p-type back gate 402, and a p-type buried layer (PBL in FIG. 4) 406 over the n-type buried layer 404. The PNP device 400 also includes a n-type drift (NDRIFT in FIG. 4) region 408 in the p-type buried layer 406. Also, a first p-type channel (P+ in FIG. 4) 410 is included in the n-type drift region 408. The PNP device 400 also includes an n-type channel (N+ in FIG. 4) 412 in the n-type drift region, where the n-type channel 412 is spaced from the first p-type channel 410A. The PNP device 400 also includes a second p-type channel (P+ in FIG. 4) 410B in the p-type buried layer 406 and spaced from the n-type drift region 408.

As shown, the PNP device 400 also includes deep trenches (DT in FIG. 4) 414A and 414B extending from the p-type back gate 402 to a contact surface 424 of the PNP device 400. In the example of FIG. 4, an anode electrode 422 at the contact surface 424 is coupled to the second p-type channel 410B and to the PBKG 402 through a conductive path 416 of a deep trench 414A and/or 414B. This anode electrode 422 of the PNP device 400 is coupled to an internal ground node at the output of device circuitry (e.g., the internal ground node 284 at the output of device circuitry 216 in FIGS. 2 and 3) of a loop-powered device or IC as described herein. Also, a cathode electrode 420 at the contact surface 424 is coupled to the first p-type channel 410A, the n-type channel 412 and to the NBL 404. This cathode electrode 420 of the PNP device 400 would be coupled to a loop ground terminal (e.g., the loop ground terminal 240 in FIGS. 2 and 3) as described herein. In FIG. 4B, a schematic diagram representation of the PNP device 400 is shown.

Figure 5:
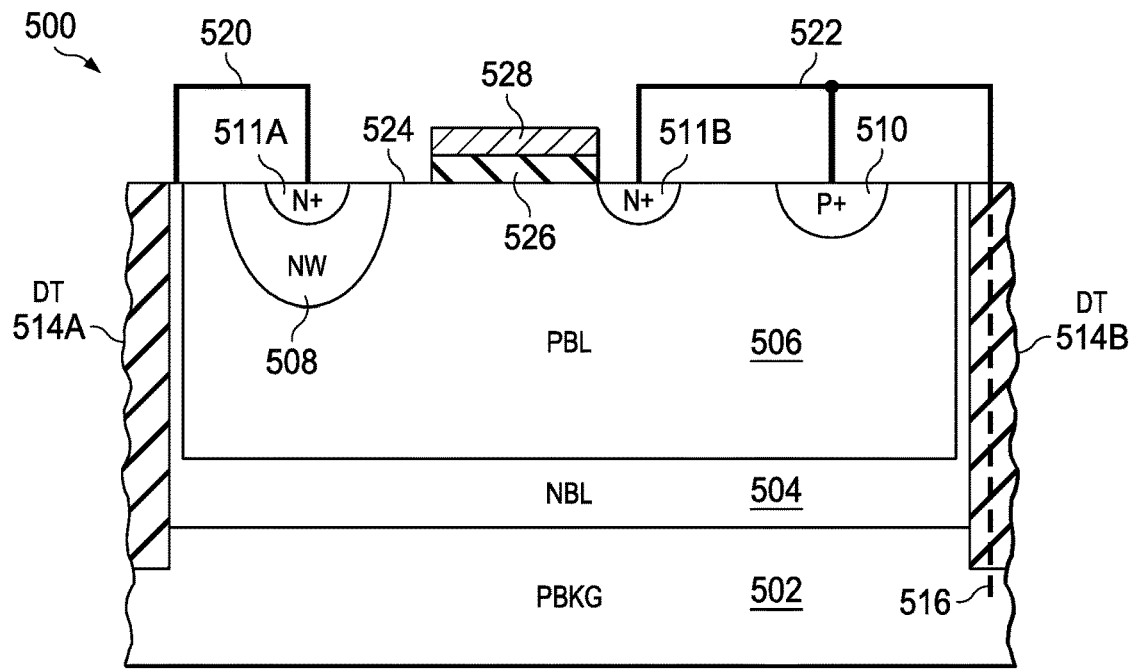
FIG. 5 is a cross-sectional view of an active switch for the low-side reverse wiring protection circuit of FIG. 3 in accordance with some examples.

FIG. 5 is a cross-sectional view of an active switch 500 (an example of S1 in FIG. 3) for the low-side reverse wiring protection circuit of FIG. 3 in accordance with some examples. As shown, the active switch 500 includes a p-type substrate or back gate (PBKG in FIG. 5) 502, an n-type buried layer (NBL in FIG. 5) 504 over the p-type back gate 502, and a p-type buried layer (PBL in FIG. 5) 506 over the n-type buried layer 504. The active switch 500 also includes a n-type well region (NW in FIG. 5) 508 in the p-type buried layer 506, and a first n-type channel (N+ in FIG. 5) 511A in the n-type well region 508. The active switch 500 also includes a second n-type channel 511B (N+ in FIG. 5) in the p-type buried layer 506, where the second n-type channel 511B is spaced from the n-type well region 508. The active switch 500 also includes a p-type channel (P+ in FIG. 5) 510 in the p-type buried layer 506, where the p-type channel 510 is spaced from the n-type well region 508 and the second n-type channel 511B. The active switch 500 also includes deep trenches (DT in FIG. 5) 514A and 514B extending from the p-type back gate to a contact surface 524 of the active switch 500.

In the example of FIG. 5, the active switch 500 also includes an anode electrode 522 at the contact surface 524 coupled to the second n-type channel 511B, the p-type channel 510, and the PBKG 502 through a conductive path 516 of a deep trench 514A and/or 514B. This anode electrode 522 of the active switch 500 is coupled to the internal ground node at the output of device circuitry (e.g., the internal ground node at the output of device circuitry 284 in FIGS. 2 and 3) of a loop-powered device or IC as described herein. The active switch 500 also includes a cathode electrode 520 at the contact surface 524 coupled to the first n-type channel 511A and the NBL 504. This cathode electrode 520 of the active switch 500 would be coupled to a loop ground terminal (e.g., the loop ground terminal 240 in FIGS. 2 and 3) of a loop-powered device or IC as described herein. In FIG. 5, the active switch 500 also includes a gate terminal 528 at the contact surface 524. As shown, the gate terminal 528 is isolated from (e.g., using isolation material 526) and is between the n-type well region 508 and the second n-type channel 511B.

Figure 4A:
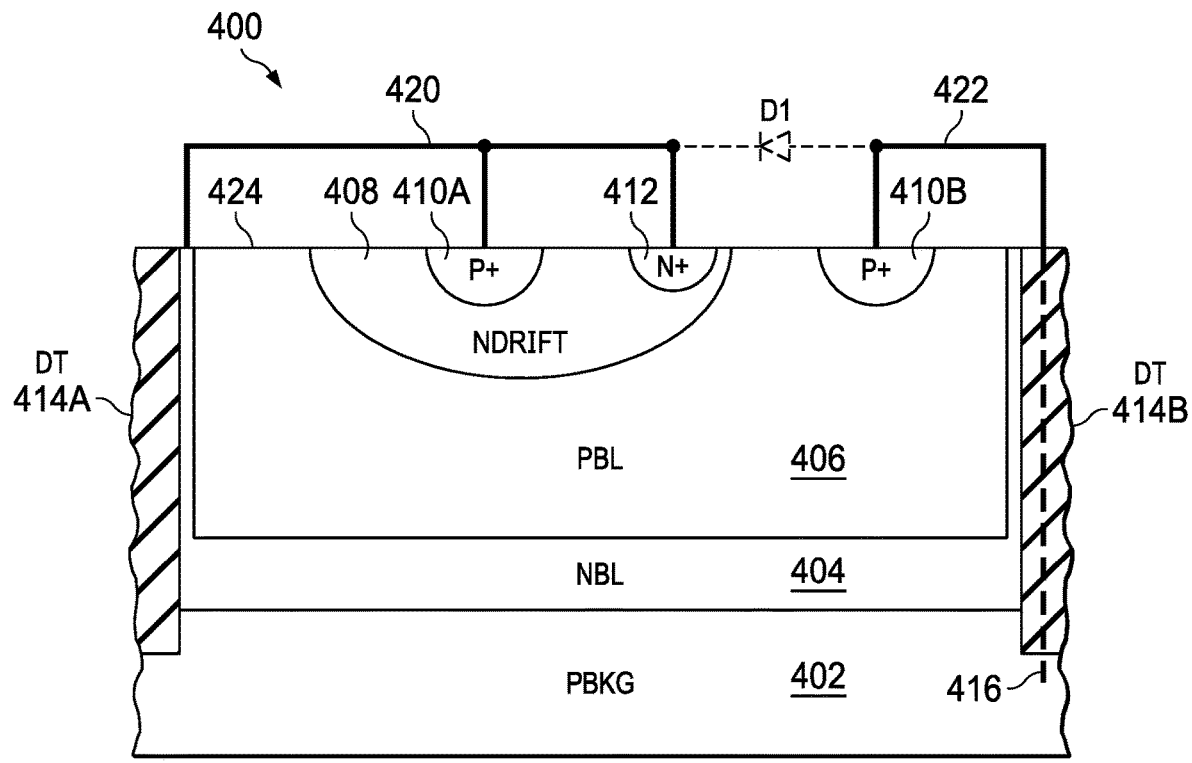
FIG. 4A is a cross-sectional view of a PNP device for the low-side reverse wiring protection circuit of FIG. 2 in accordance with some examples.
Figure 4B:
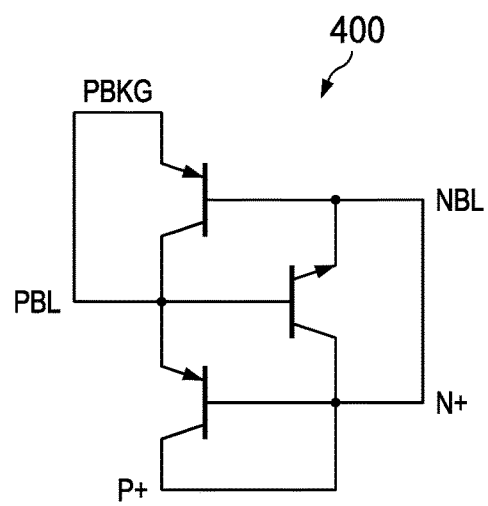
FIG. 4B is a schematic diagram of the PNP device of FIG. 4A in accordance with some examples.

In some examples, a low-side reverse wiring protection circuit (e.g., the low-side reverse wiring protection circuit 218 in FIG. 2, or the low-side reverse wiring protection circuit 218A in FIG. 3) includes an active switch (e.g., S1 in FIG. 3, or the active switch 500 in FIG. 5) in parallel with a PNP device (e.g., D1 in FIG. 3, or the PNP device 400 in FIGS. 4A and 4B). In some examples, the active switch and the PNP device are between an internal ground node (e.g., the internal ground node 284 in FIGS. 2 and 3) of device circuitry (e.g., the device circuitry 216 in FIG. 2, or the device circuitry 216A in FIG. 3) and the loop ground terminal (e.g., the loop ground terminal 240 in FIGS. 2 and 3) of a loop-powered device or related IC. In operation, the active switch is closed (turned on) when the device circuitry of a loop-powered device is turned on. Otherwise (when the device circuitry of a loop-powered device is turned off), the active switch is open (turned off).

Figure 6:
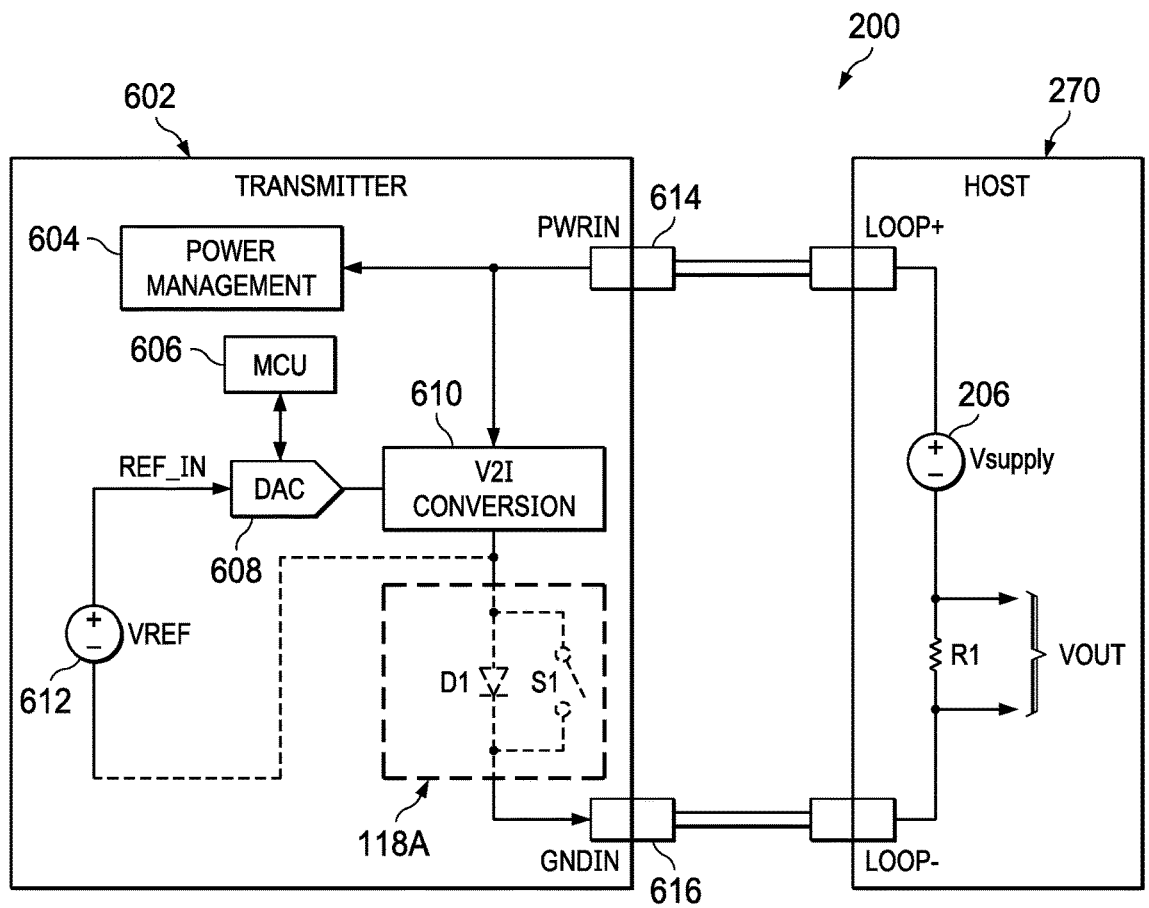
FIG. 6 is another block diagram showing a two-wire current loop system in accordance with some examples.

FIG. 6 is another block diagram showing a two-wire current loop system 600 in accordance with some examples. In the two-wire current loop system 600, a transmitter 602 (an example the transmitter 202) and the host 270 are represented. As shown, the transmitter 602 includes a power management circuit 604 and a V2I converter 610 coupled to a power supply (PWRIN) terminal 614 (an example of the power supply terminal 220 in FIG. 2). The power management circuit generates multiple power supplies used by devices on the transmitter 602 from PWRIN 614 voltage domain. The transmitter 602 also includes a microcontroller (MCU) 606 coupled to a DAC 608. The MCU 606 configures the DAC 608 and other components (e.g., a sensor and an ADC for the sensor) and provides a DAC data code corresponding to the sensor output value with the DAC 608 through a digital interface. In the example of FIG. 6, a voltage source 612 provides a reference signal (REF_IN) to the DAC 608. In response to the DAC code from the MCU 606, the DAC 608 outputs an analog voltage value, which is used to adjust the current output from the V2I converter 610. At the current output node of the V2I converter 610, a low-side reverse wiring protection circuit 218A is used. More specifically, the low-side reverse wiring protection circuit 218A is between a current output node of the V2I converter 610 and a ground (GNDIN) terminal 616 (an example of the loop ground terminal 240 in FIG. 2). In different examples, one or more of the power management circuit 604, the MCU 606, the DAC 608, and the V2I converter 610 correspond to the device circuitry 282 of FIG. 2.

The disclosed loop-powered devices integrate a power-ground reverse wiring protection cell on a monolithic die at an application of 2wire current loop device. The power-ground reverse wiring test is commonly performed as an industrial standard board test. To protect from the reverse wiring stress, a reverse wiring protection circuit is needed to limit the current flow direction to the loop-powered device. Previous protection efforts include use of a high-side reverse wiring protection circuit. However, this involved two separate ICs, one for protection cell, and the other for the device circuitry of the loop-powered device. With the disclosed low-side reverse wiring protection circuit a monolithic IC solution is presented. By adding the active switch in parallel with the PNP device, a voltage drop due to the PNP device is avoided. The monolithic IC solution presented herein reduces package size and cost. In different examples, the device circuitry of a loop-powered device with the monolithic IC solution for reverse wiring protection, as described herein, includes a DAC circuit, an ADC circuit, a V2I circuit, an XTR two-stage operational amplifier circuit, and/or other circuits.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A two-wire current loop system, comprising:
  a current loop with a transmitter and a host; and
  a monolithic integrated circuit included with the transmitter, wherein the monolithic integrated circuit comprises:
    a power supply terminal coupled to the current loop;
    a loop ground terminal coupled to the current loop and configured to output a current to the current loop;
    device circuitry with a power supply node and an internal ground node, where the power supply node of the device circuitry is coupled to the power supply terminal; and
    a reverse wiring protection circuit coupled between the internal ground node of the device circuitry and the loop ground terminal;
  wherein the reverse wiring protection circuit comprises a PNP device, the PNP device comprising:
    a p-type back gate;
    an n-type buried layer over the p-type back gate;
    a p-type buried layer over the n-type buried layer;
    a n-type drift region in the p-type buried layer;
    a first p-type channel in the n-type drift region;
    a n-type channel in the n-type drift region;
    a second p-type channel in the p-type buried layer and spaced from the n-type drift region; and
    deep trenches extending from the p-type back gate to a contact surface of the PNP device.

2. The two-wire current loop system of claim 1, wherein the PNP device further comprises:
  an anode electrode at the contact surface of the PNP device and coupled to: 1) the p-type back gate through a conductive path of the deep trenches; 2) the second p-type channel; and 3) the internal ground node of the device circuitry; and
  a cathode electrode at the contact surface of the PNP device and coupled to: 1) the first p-type channel; 2) the n-type channel; 3) the n-type buried layer; and 4) the loop ground terminal.

3. A two-wire current loop system, comprising:
  a current loop with a transmitter and a host; and
  a monolithic integrated circuit included with the transmitter, wherein the monolithic integrated circuit comprises:
    a power supply terminal coupled to the current loop;

a loop ground terminal coupled to the current loop and configured to output a current to the current loop;

device circuitry with a power supply node and an internal ground node, where the power supply node of the device circuitry is coupled to the power supply terminal; and a reverse wiring protection circuit coupled between the internal ground node of the device circuitry and the loop ground terminal;

wherein the reverse wiring protection circuit comprises a an active switch;

wherein the active switch comprises:

a p-type back gate;

an n-type buried layer over the p-type back gate;

a p-type buried layer over the n-type buried layer;

a n-type well region in the p-type buried layer;

a first n-type channel in the n-type well region;

a second n-type channel in the p-type buried layer, wherein the second n-type channel is spaced from the n-type well region;

a p-type channel in the p-type buried layer, wherein the p-type channel is spaced from the n-type well region and the second n-type channel; and deep trenches extending from the p-type back gate to a contact surface of the active switch.

4. The two-wire current loop system of claim 3, wherein the active switch further comprises:

an anode electrode at the contact surface of the active switch and coupled to: 1) the p-type back gate through a conductive path of the deep trenches; 2) the second n-type channel; 3) the p-type channel; and 4) the internal ground node of the device circuitry; and a cathode electrode at the contact surface of the active switch and coupled to: 1) the first n-type channel; 2) the n-type buried layer; and 3) the loop ground terminal.

5. The two-wire current loop system of claim 4, wherein the active switch further comprises a gate terminal at the contact surface, wherein the gate terminal is isolated from and is between the n-type well region and the second n-type channel.

6. A two-wire loop-powered device, comprising:

a monolithic integrated circuit with:

a power supply terminal;

a loop ground terminal;

device circuitry having power supply node and an internal ground node, wherein the power supply node of the device circuitry is coupled to the power supply terminal; and a reverse wiring protection circuit coupled between the internal ground node of the device circuitry and the loop ground terminal;

wherein the reverse wiring protection circuit comprises a PNP device, the PNP device comprising:

a p-type back gate;

an n-type buried layer over the p-type back gate;

a p-type buried layer over the n-type buried layer;

a n-type drift region in the p-type buried layer;

a first p-type channel in the n-type drift region;

a n-type channel in the n-type drift region;

a second p-type channel in the p-type buried layer and spaced from the n-type drift region; and deep trenches extending from the p-type back gate to a contact surface of the PNP device.

7. The two-wire loop-powered device of claim 6, wherein the PNP device further comprises:

an anode electrode at the contact surface of the PNP device and coupled to: 1) the p-type back gate through a conductive path of the deep trenches; 2) the second p-type channel; 3) the internal ground node of the device circuitry; and a cathode electrode at the contact surface of the PNP device and coupled to: 1) the first p-type channel; 2) the n-type channel; 3) the n-type buried layer; and 4) the loop ground terminal.

8. A two-wire loop-powered device, comprising:

a monolithic integrated circuit with:

a power supply terminal;

a loop ground terminal;

device circuitry having power supply node and an internal ground node, wherein the power supply node of the device circuitry is coupled to the power supply terminal; and a reverse wiring protection circuit coupled between the internal ground node of the device circuitry and the loop ground terminal;

wherein the reverse wiring protection circuit comprises an active switch in parallel with an PNP device between the internal ground node of the device circuitry and the loop ground terminal, wherein the active switch is closed when the device circuitry is turned on, and wherein the active switch is open when the device circuitry is turned off;

wherein the active switch comprises:

a p-type back gate;

an n-type buried layer over the p-type back gate;

a p-type buried layer over the n-type buried layer;

a n-type well region in the p-type buried layer;

a first n-type channel in the n-type well region;

a second n-type channel in the p-type buried layer, wherein the second n-type channel is spaced from the n-type well region;

a p-type channel in the p-type buried layer, wherein the p-type channel is spaced from the n-type well region and the second n-type channel; and deep trenches extending from the p-type back gate to a contact surface of the active switch.

9. The two-wire loop-powered device of claim 8, wherein the active switch further comprises:

an anode electrode at the contact surface of the active switch and coupled to: 1) the p-type back gate through a conductive path of the deep trenches; 2) the second n-type channel; 3) the p-type channel; 4) the internal ground node of the device circuitry; and a cathode electrode at the contact surface of the active switch and coupled to: 1) the first n-type channel; 2) the n-type buried layer; and 3) a loop ground terminal.

10. The two-wire loop-powered device of claim 9, wherein the active switch further comprises a gate terminal at the contact surface, wherein the gate terminal is isolated from and is between the n-type well region and the second n-type channel.

11. A monolithic integrated circuit, comprising:

a power supply terminal;

a loop ground terminal;

device circuitry coupled to the power supply terminal; and a reverse wiring protection circuit coupled between an internal ground node of the device circuitry and the loop ground terminal;

wherein the reverse wiring protection circuit comprises an active switch in parallel with a PNP device between the internal ground node of the device circuitry and the loop ground terminal, wherein the active switch is closed when the device circuitry is turned on, and wherein the active switch is open when the device circuitry is turned off;

wherein the PNP device comprises:

a p-type back gate;

an n-type buried layer over the p-type back gate;

a p-type buried layer over the n-type buried layer;

a n-type drift region in the p-type buried layer;

a first p-type channel in the n-type drift region;

a n-type channel in the n-type drift region;

a second p-type channel in the p-type buried layer and spaced from the n-type drift region;

deep trenches extending from the p-type back gate to a contact surface of the PNP device;

an anode electrode at the contact surface of the PNP device and coupled to: 1) the p-type back gate through a conductive path of the deep trenches; 2) the second p-type channel; and 3) the internal ground node of the device circuitry; and a cathode electrode at the contact surface of the PNP device and coupled to: 1) the first p-type channel; 2) the n-type channel; 3) the n-type buried layer; and 4) a loop ground terminal.

12. A monolithic integrated circuit, comprising:

a power supply terminal;

a loop ground terminal;

device circuitry coupled to the power supply terminal; and a reverse wiring protection circuit coupled between an internal ground node of the device circuitry and the loop ground terminal;

wherein the reverse wiring protection circuit comprises an active switch in parallel with a PNP device between the internal ground node of the device circuitry and the loop ground terminal, wherein the active switch is closed when the device circuitry is turned on, and wherein the active switch is open when the device circuitry is turned off;

wherein the active switch comprises:

a p-type back gate;

an n-type buried layer over the p-type back gate;

a p-type buried layer over the n-type buried layer;

a n-type well region in the p-type buried layer;

a first n-type channel in the n-type well region;

a second n-type channel in the p-type buried layer, wherein the second n-type channel is spaced from the n-type well region;

a p-type channel in the p-type buried layer, wherein the p-type channel is spaced from the n-type well region and the second n-type channel; and deep trenches extending from the p-type back gate to a contact surface of the active switch;

an anode electrode at the contact surface of the active switch and coupled to: 1) the p-type back gate through a conductive path of the deep trenches; 2) the second n-type channel; 3) the p-type channel; 4) the internal ground node of the device circuitry;

a cathode electrode at the contact surface of the active switch and coupled to: 1) the first n-type channel; 2) the n-type buried layer; and 3) a loop ground terminal; and a gate terminal at the contact surface of the active switch, wherein the gate terminal is isolated from and is between the n-type well region and the second n-type channel.

* * * * *